Figure 1:
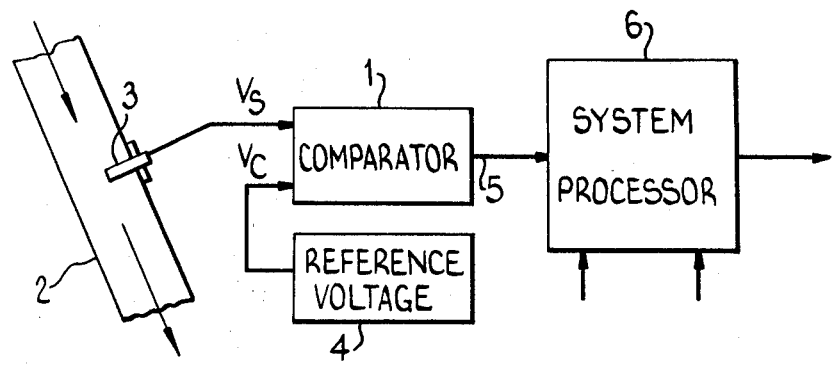

United States Patent [19]

Fowler

[11] 4,316,105
[45] Feb. 16, 1982

[54] COMPARATOR

[75] Inventor: Albert L. Fowler, Kirkcaldry, Scotland

[73] Assignee: Hughes Aircraft Company, Culver City, Calif.

[21] Appl. No.: 21,877

[22] Filed: Mar. 19, 1979

[30] Foreign Application Priority Data

Apr. 12, 1978 [GB] United Kingdom ............... 14419/78

[51] Int. Cl.³ ............................................. H03K 5/24
[52] U.S. Cl. ................................. 307/362; 307/355; 328/147
[58] Field of Search ............... 307/350, 355, 356, 362, 307/363; 328/147, 148, 149, 151; 73/27 R, 30

[56] References Cited

U.S. PATENT DOCUMENTS 3,676,702 7/1972 McGrogan, Jr. ............... 307/355 X

Primary Examiner—John Zazworsky
Attorney, Agent, or Firm—John Holtrichter, Jr.; W. H. MacAllister

[57] ABSTRACT

A comparator for comparing the relative magnitudes of first and second voltages and for providing a binary output indicative of which of the voltages is the greater. The voltages are applied sequentially to a capacitor during first and second periods respectively. An inverter has its input connected to the capacitor, and a voltage bias source applies a bias voltage to the input of the inverter in such a manner as to cause the output of the inverter to assume a predetermined voltage during the first period and a voltage either greater or less than the predetermined voltage during the second period, depending upon whether the first voltage is greater or less than the second voltage. A flip-flop is connected to the output of the inverter such as to be either set or reset in response to the output of the inverter being greater or less than the predetermined voltage during the second period.

2 Claims, 4 Drawing Figures

COMPARATOR

This invention relates to a comparator for comparing the magnitudes of first and second voltages and for providing a binary output signal indicative of whether the magnitude of the first voltage is greater or less than the magnitude of the second voltage. The present invention has particular but not exclusive application to processing electrical signals produced by sensors which sense operating parameters of an internal combustion engine.

Recently, electronic ignition and fuel control systems have been developed for use with automobile internal combustion engines, which permit operation of an engine to be controlled in dependence upon the state of many more operating parameters of the engine than has been conventionally possible. Electrical sensors have been developed to sense the operating parameters of the engine, the sensors providing electrical output voltages which are indicative by their magnitude of the value of the sensed parameters.

In order to process the signals from an electrical sensor into a form suitable for processing in the electronic system, it is sometimes desirable to compare the voltage developed by the sensor with a reference voltage and determine if the sensor voltage is greater or less than the reference voltage.

Accordingly, it is an object of the present invention to provide an improved comparator for comparing the magnitudes of first and second voltages to provide a binary output signal indicative of the relative magnitudes of the voltages.

In accordance with the present invention there is provided a comparator for comparing the magnitudes of first and second voltages, comprising inputs for receiving said voltages respectively, a capacitor, switching means arranged to apply from the inputs to the capacitor said first voltage during a sequence of first periods and said second voltage during a sequence of second periods each occurring after a respective one of said first periods, an inverter having its input connected to the capacitor, biasing means arranged to apply a bias voltage to the input of the inverter in such a manner as to cause the output from the inverter to assume a predetermined voltage during said first periods and to assume during said second periods a voltage either greater or less than said predetermined voltage in dependence upon whether said first voltage is greater or less than said second voltage, and a flip-flop arranged to be either set or reset in response to the output of the inverter being either greater or less than said predetermined voltage during said second periods whereby the set or reset condition of the flip-flop is indicative of whether the magnitude of said first voltage is greater or less than the magnitude of said second voltage.

Preferably the flip-flop comprises a D-type flip-flop and a generating means is provided for applying a control clock waveform to the flip-flop, said clock waveform being arranged to enable the flip-flop to be set or reset only in response to the output of said inverter during said second periods.

Furthermore, the biasing means preferably comprises an inverter having its input and output connected together in a feedback loop, and means defining a resistor interconnecting the inputs of the inverters, the inverters constituting a matched pair sharing the same thermal environment.

Figure 2:
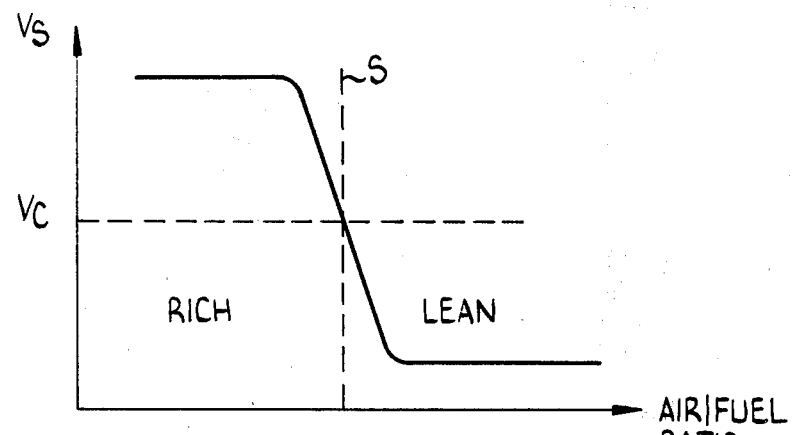
Figure 3:
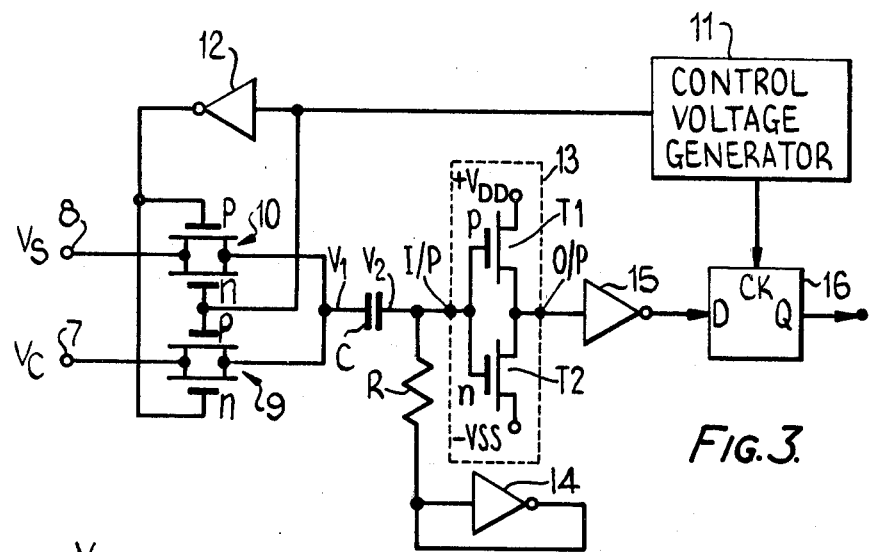
Figure 4:
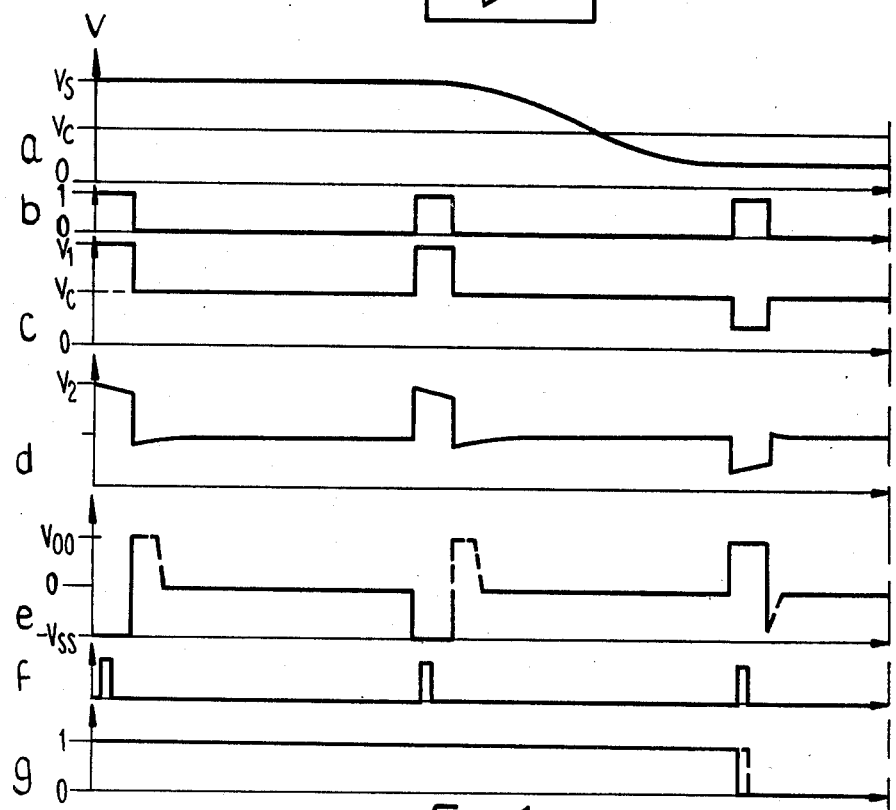

In order that the invention may be more fully understood and readily carried into effect an embodiment thereof will now be described by way of illustrative example with reference to the accompanying drawings in which:

FIG. 1 is a schematic block diagram of a comparator of the present invention used in an oxygen sensing arrangement for sensing oxygen levels in the exhaust gas emission of an internal combustion engine, FIG. 2 illustrates the voltage output characteristic of an oxygen sensor shown in FIG. 1, FIG. 3 illustrates in more detail the circuit diagram of the comparator shown in FIG. 1, and FIG. 4 illustrates various waveforms developed in use of the circuit shown in FIG. 3.

Referring firstly to FIG. 1, there is shown a comparator 1 of the present invention used in connection with an internal combustion engine (not shown), to provide a binary signal indicative of whether a rich or lean fuel-/air mixture is being fed to the engine. The comparator is connected in an arrangement which measures the oxygen level pertaining in the exhaust gases of the engine, the gases flowing through an exhaust pipe 2. The oxygen level in the exhaust gases is detected by a sensor 3 which comprises a zirconium dioxide element adapted to produce a voltage $V_s$ indicative by its magnitude of the oxygen level in the exhaust gases. One suitable sensor is described in British Patent Specification No. 1,441,660.

Now, it can be shown that the oxygen level obtaining in the exhaust gases of the engine is a function of the ratio of fuel to air in the mixture thereof supplied to the engine, and thus the sensor voltage $V_s$ is a function of the fuel to air ratio of the mixture. A graph of the sensor voltage $V_s$ as fuel to air ratio the engine, is shown in FIG. 2. The appropriate fuel to air ratio for achieving stoichometric combustion in the engine, is shown by the dotted line S, the regions to the right and left of the line indicating lean and rich mixtures respectively. It will thus be seen that for a rich mixture, the sensor voltage $V_s$ exceeds a voltage $V_c$, whereas for a lean mixture, the sensor voltage $V_s$ is less than the voltage $V_c$. Now, in the apparatus shown in FIG. 1, an appropriate reference voltage $V_c$ indicative of stoichometric combustion conditions, is established by a reference voltage generator 4 and is compared with the voltage $V_s$ produced by the sensor 3, by means of the comparator 1, the comparator providing on line 5 a binary "1" or "0" output signal indicative respectively of a rich or lean fuel/air mixture supplied to the engine. The binary output signal is supplied as one of a plurality of inputs to a system processor 6 which controls the supply of fuel and/or the timing of the engine's spark ignition in accordance with a plurality of different engine operating parameters.

The comparator 1 will now be described in more detail with reference to FIG. 3. The voltages $V_s$, $V_c$ produced by the sensor 3 and the voltage generator 4, are applied to input terminals 7 and 8. The terminals 7 and 8 are each series connected to a capacitor C through a switching means in the form of two complementary metal oxide semiconductor (CMOS) transmission gates 9 and 10. The gate electrodes of the complementary transistors of the gates 9, 10 are connected to a control voltage generator 11, to receive therefrom either a control waveform or an inverse thereof, the inverse waveform being produced by a CMOS inverter 12. The arrangement of the transmission gates 9, 10 is such that when the gate 9 is switched on in response to the control waveform to provide a conductive path from the terminal 7 of the capacitor C, the transmission gate 10 is rendered non-conductive in response to the control waveform, and vice versa.

The control waveform produced by the control voltage generator is shown in FIG. 4b. The waveform is rectangular and alternates cyclically between 1 and 0 states but is for the most part in its 0 state. Thus, for the periods that the control waveform is in its 1 state, the voltage $V_c$ is connected to the capacitor C, and for the periods that the waveform is in its 0 state, the voltage $V_s$ is connected to the capacitor C. The input waveform to the capacitor is designated $V_1$ in FIG. 3 and an example of the waveform $V_1$ is shown in FIG. 4c, in respect of the values of $V_s$ and $V_c$ which are shown in FIG. 4a. In FIG. 4a, the sensor voltage is shown as changing from a value exceeding $V_c$ (indicating a rich mixture) to a value less than $V_c$ (indicating a lean mixture), and accordingly the waveform $V_1$ shown in FIG. 4c consists of rectangular pulses during the periods that the control waveform of FIG. 4b is in a "1" state, the rectangular pulses having a magnitude greater than $V_c$ when $V_s$ is greater than $V_c$ and the pulses having a magnitude less than $V_c$ when $V_s$ is less than $V_c$.

The input waveform $V_1$ causes an output waveform $V_2$ to be produced by the capacitor C. The output waveform $V_2$ is shown in FIG. 4d and is substantially the same as waveform $V_1$ although its rectangularity is degraded somewhat as a result of the capacitor C discharging during the pulses in the waveform. In order to reduce the effects of discharging of the capacitor on the rectangularity of the waveform $V_2$, the periods that the control waveform of FIG. 4b is in its 1 state, are made much shorter than the periods that the control waveform is in its 0 state.

The output waveform $V_2$ is applied to a CMOS inverter 13 shown in dotted outline. As is well known, a CMOS inverter comprises p- and n-channel transistors T1 and T2 connected in series between positive and negative voltage rails $+V_{DD}$ and $-V_{SS}$. The gates of the transistors are connected together to define an input I/P and the inverter has an output O/P. When a positive going signal is applied to the input I/P, the n-channel transistor will become switched on to apply a negative voltage from the rail $-V_{SS}$ to the output O/P. Similarly when a negative going signal is applied to the input I/P, the p-channel transistor becomes switched on to apply a positive voltage to the output O/P. Furthermore, when the voltage applied to the input I/P is a particular value between $V_{DD}$ and $V_{SS}$, the voltage at the output O/P will be 0 volts. The particular value of input voltage which produces a 0 volt output, is itself typically 0 volts but will vary depending upon operating conditions such as temperature etc., to which the inverter is subjected.

Now in the present circuit, a d.c. biasing arrangement comprising a CMOS inverter 14 and a resistor R, is connected to the input I/P of the inverter 13. The biasing arrangement applies to the input I/P a voltage which is so selected that the waveform $V_2$ is at the aforementioned particular voltage appropriate to cause an output voltage of approximately 0 volts at the output O/P of the inverter 13, for the periods that the control waveform of FIG. 4b is in its 0 state, with the result that during the periods that the control waveform is in its 1 state, the substantially rectangular pulses in the waveform $V_2$ will cause the inverter 13 to produce rectangular output voltage pulses of either $+V_{DD}$ or $-V_{SS}$ in dependence on whether the substantially rectangular pulses in the waveform $V_2$ are positive or negative going. The waveform produced at the output O/P of the inverter 13 is shown in FIG. 4e in respect of the waveform $V_2$ shown in FIG. 4d. It will be seen that the rectangularity of the output waveform of FIG. 4e will be degraded somewhat as shown in dotted outline, as a result of the non-rectangular nature of the waveform $V_2$, but such degradation of the waveform does not effect operation of the circuit, as will now be explained.

The output of the inverter 13 is connected to a further CMOS inverter 15 which produces an output signal that is the inverse of the waveform shown in FIG. 4e. The output signal from the inverter 15 is fed to the D input of a D-type flip-flop 16. The flip-flop is clocked by a control clock waveform generated by the generator 11 as shown in FIG. 4f. The control clock waveform comprises clock pulses which respectively occur during the periods that the control waveform of FIG. 4b is in its 1 state, and as a result the flip-flop 16 is rendered responsive to the positive or negative polarity of the output of the inverter 15 which occurs during the periods that the control waveform of FIG. 4b is in its 1 state. Accordingly, if during such periods the voltage $V_s$ is greater than $V_c$, the voltage produced by inverter 15 will be greater than 0 volts and the flip-flop 16 will be set to a 1 state, but if $V_s$ is less than $V_c$, the flip-flop will be reset to a 0 state. The Q output of the flip-flop 16 is shown in FIG. 4g, for the transition of $V_s$ shown in FIG. 4a. It will thus be seen that when $V_s$ is greater than $V_c$, the bistable provides a binary "1" output but that at the third clock pulse of FIG. 4f, and in response to $V_s$ becoming less than $V_c$, the bistable is reset to produce a binary "0" output, thereby indicating the transition in the value of $V_s$ relative to $V_c$.

The gating effected by the clock pulses of FIG. 4f renders the flip-flop 16 responsive to the magnitude of the voltage produced by inverter 15 only during middle portions of the periods that the control waveform of FIG. 4b is in its 1 state and accordingly the transients of the waveform of FIG. 4e cannot produce spurious setting or resetting of the flip-flop 16.

The d.c. biasing arrangement comprising the inverter 14 and the resistor R, will now be described in more detail. As was mentioned hereinbefore, the particular voltage to be applied to the input I/P of the inverter 13 to achieve a 0 volt output therefrom varies as a function of the inverter's temperature and other operating parameters and accordingly it is desirable that the d.c. bias voltage provided to the input of the inverter 13 adjusts itself in magnitude automatically to accommodate any changes in temperature and other operating parameters. To this end, the inverters 13 and 14 are constructed as a matched pair in the same thermal environment, receiving the same rail voltages $V_{DD}$, $V_{SS}$. The inverter 14 has its output connected to its input in a feedback loop and as a result, the input and output assume the same voltage level $V_o$ which is disposed between the rail voltages $V_{DD}$, $V_{SS}$. This voltage level $V_o$ is a function of the temperature and other operating parameters of the inverter 14, and varies as a function of these operating parameters in the same way as the aforementioned voltage which needs to be applied to the input I/P of the inverter 13 to achieve a 0 volt output voltage therefrom. An appropriate proportion of the voltage $V_o$ is dropped across the resistor R (NB. in practice this voltage drop is zero) such as to appropriately bias the input I/P of the inverter 13 so that the voltage level of the waveform $V_2$, during the periods that the control waveform of FIG. 4b is in its 0 state, is equal to the aforementioned voltage appropriate to achieve a zero voltage output from the inverter 13. Since the voltage $V_o$ varies as a function of the operating parameters of the inverter 13, the bias voltage produced by the inverter 14 and the resistor R will adjust its magnitude automatically in accordance with temperature changes and changes of other operating parameters of the inverter 13.

Many modifications and variations of the above described comparator arrangement are possible and for example the comparator could be used with a sensor other than an oxygen sensor. Also, the reference voltage can be made to vary in magnitude as a function of the combustion conditions of the engine.

I claim:

1. A comparator for comparing the magnitude of first and second voltages, comprising inputs for receiving said voltages respectively, a capacitor, switching means arranged to apply from the inputs to the capacitor said first voltage during a sequence of first periods and said second voltage during a sequence of second periods each occurring after a respective one of said first periods, an inverter having its input connected to the capacitor, biasing means arranged to apply a bias voltage to the input of the inverter in such a manner as to cause the output from the inverter to assume a predetermined voltage during said first periods and to assume during said second periods a voltage either greater or less than said predetermined voltage in dependence upon whether said first voltage is greater or less than said second voltage, said biasing means comprising an inverter having its input and output connected together in a feedback loop, and means defining a resistor interconnecting the inputs of the inverters, the inverters constituting a matched pair sharing the same thermal environment, and a flip-flop arranged to be either set or reset in response to the output of the inverter being either greater or less than said predetermined voltage during said second periods whereby the set or reset condition of the flip-flop is indicative of whether the magnitude of said first voltage is greater or less than the magnitude of said second voltage.

2. A comparator in accordance with claim 1 wherein said inverters comprise CMOS inverters.

* * * * *